(12) United States Patent
Wristers et al.

(10) Patent No.: US 6,707,106 B1
(45) Date of Patent: Mar. 16, 2004

(54) SEMICONDUCTOR DEVICE WITH TENSILE STRAIN SILICON INTRODUCED BY COMPRESSIVE MATERIAL IN A BURIED OXIDE LAYER

(75) Inventors: Derick J. Wristers, Bee Caves, TX (US); Qi Xiang, San Jose, CA (US); James F. Buller, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/272,979

(22) Filed: Oct. 18, 2002

(51) Int. Cl.[7] ............... H01L 27/01; H01L 27/12; H01L 31/0392
(52) U.S. Cl. ............. 257/347; 257/616; 257/617
(58) Field of Search .................. 257/347, 616, 257/617

(56) References Cited

U.S. PATENT DOCUMENTS

| | | |
|---|---|---|
| 5,461,243 A * | 10/1995 | Ek et al. ............ 257/190 |
| 5,665,613 A | 9/1997 | Nakashima et al. |
| 5,728,624 A | 3/1998 | Linn et al. |
| 5,759,898 A | 6/1998 | Ek et al. |
| 5,897,362 A | 4/1999 | Wallace |
| 6,174,820 B1 | 1/2001 | Habermehl et al. |
| 6,204,546 B1 | 3/2001 | Roitman et al. |
| 6,335,231 B1 | 1/2002 | Yamazaki et al. |
| 6,339,232 B1 | 1/2002 | Takagi |
| 2003/0052406 A1 * | 3/2003 | Lochtefeld et al. ......... 257/717 |
| 2003/0077867 A1 * | 4/2003 | Fitzergald ............... 438/285 |

* cited by examiner

*Primary Examiner*—Ngân V. Ngô

(57) ABSTRACT

A semiconductor device is provided with the high-speed capabilities of silicon on insulator (SOI) and strained silicon technologies, without requiring the formation of a silicon germanium layer. A layer of compressive material is formed on a SOI semiconductor substrate to induce strain in the overlying silicon layer. The compressive materials include silicon oxynitride, phosphorous, silicon nitride, and boron/phosphorous doped silica glass.

20 Claims, 9 Drawing Sheets

SEMICONDUCTOR DEVICE WITH TENSILE STRAIN SILICON INTRODUCED BY COMPRESSIVE MATERIAL IN A BURIED OXIDE LAYER

TECHNICAL FIELD

The present invention relates to manufacturing semiconductor devices and, more particularly, to an improved semiconductor device comprising silicon on insulator (SOI) technology.

BACKGROUND OF THE INVENTION

An important aim of ongoing research in the semiconductor industry is increasing semiconductor performance while decreasing power consumption in semiconductor devices. Planar transistors, such as metal oxide semiconductor field effect transistors (MOSFET) are particularly well suited for use in high-density integrated circuits. As the size of MOSFET and other devices decrease, the dimensions of source drain regions, channel regions, and gate electrodes of the devices, also decrease.

The design of ever-smaller planar transistors with short channel lengths makes it necessary to provide very shallow source/drain junctions. Shallow junctions are necessary to avoid lateral diffusion of implanted dopants into the channel, since such diffusion disadvantageously contributes to leakage currents and poor breakdown performance. Shallow source/drain junctions, with a thickness on the order of 1000 Å or less, are generally required for acceptable performance in short channel devices.

Silicon on insulator (SOI) technology allows the formation of high-speed, shallow-junction devices. In addition, SOI devices improve performance by reducing parasitic junction capacitance. Although SOI technology improves the performance of shallow-junction devices, devices that require deeper junctions do not benefit from SOI. For example, devices which are temperature sensitive or which require a deep implant perform better when formed in a bulk substrate.

In a SOI substrate, a buried oxide (BOX) film made of silicon oxide is formed on single crystal silicon, and a single crystal silicon thin film is formed thereon. Various methods for fabricating such SOI substrates are known. One such method is Separation-by-Implanted Oxygen (SIMOX), wherein oxygen is ion implanted into a single crystal silicon substrate to form a buried oxide (BOX) film.

Another method of forming a SOI substrate is wafer bonding, wherein two semiconductor substrates with silicon oxide surface layers are bonded together at the silicon oxide surfaces to form a BOX layer between the two semiconductor substrates.

Another SOI technique is Smart Cut®, which also involves bonding semiconductor substrates through oxide layers. In the Smart Cut® method, one of the semiconductor substrates is doped with hydrogen ions prior to bonding. The hydrogen ion doping subsequently allows the hydrogen ion doped substrate to be split from the bonded substrates leaving behind a thin layer of silicon on the surface.

Strained silicon technology also allows the formation of higher speed devices. One method of forming strained-silicon transistors is by depositing a graded layer of silicon germanium (SiGe) on a bulk silicon wafer. A thin layer of silicon is subsequently deposited on the SiGe. The distance between atoms in the SiGe crystal lattice is greater than the distance between atoms in an ordinary silicon crystal lattice. Because there is a natural tendency of atoms inside different crystals to align with one another when one crystal is formed on another crystal, when silicon is deposited on top of SiGe the silicon atoms tend to stretch or "strain" to align with the atoms in the SiGe lattice. Electrons in the strained silicon experience less resistance and flow up to 80% faster than in ordinary crystalline silicon.

The term semiconductor devices, as used herein, is not to be limited to the specifically disclosed embodiments. Semiconductor devices, as used herein, include a wide variety of electronic devices including flip chips, flip chip/package assemblies, transistors, capacitors, microprocessors, random access memories, etc. In general, semiconductor devices refer to any electrical device comprising semiconductors.

SUMMARY OF THE INVENTION

There exists a need in the semiconductor device art for a device that combines the performance improvements of SOI technology and strained silicon technology. There exists a need in this art to provide a semiconductor device that comprises forming strained silicon layers without forming a SiGe lattice on the substrate.

These and other needs are met by embodiments of the present invention, which provide a semiconductor device comprising a semiconductor substrate and a layer of compressive material on the semiconductor substrate. A layer of strained silicon is formed on the layer of compressive material.

The earlier stated needs are also met by certain embodiments of the instant invention which provide a method of forming a semiconductor device with a strained silicon layer comprising providing a semiconductor substrate and forming a layer of compressive material on the substrate. A strained silicon layer is subsequently formed over the layer of compressive material.

This invention addresses the needs for an improved high-speed semiconductor device with improved electrical characteristics.

The foregoing and other features, aspects, and advantages of the present invention will become apparent in the following detailed description of the present invention when taken in conjunction with the accompanying drawings.

DETAILED DESCRIPTION OF THE INVENTION

Figure 1A:
FIGS. 1A–1H illustrate the formation of a SOI semiconductor device with a layer of compressive material in a buried oxide layer using a Smart Cut® process.

The present invention enables the production of improved high-speed semiconductor devices with the benefits of both SOI and strained silicon technology. The present invention further provides the higher speed offered by strained silicon technology coupled with the reduced parasitic junction capacitance benefits of SOI. These benefits are provided by combining a strained silicon layer and a SOI semiconductor substrate.

The invention will be described in conjunction with the formation of the semiconductor device illustrated in the accompanying drawings. However, this is exemplary only as the claimed invention is not limited to the formation of the specific device illustrated in the drawings.

Figure 1B:
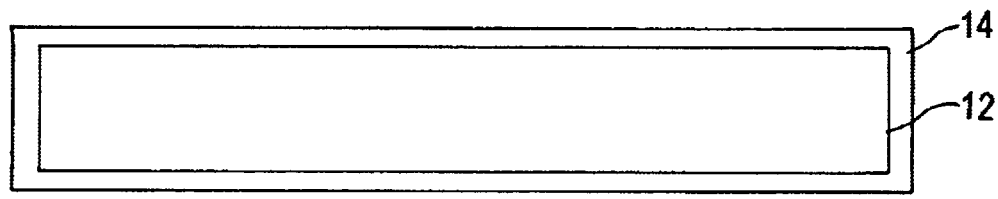
Figure 1C:
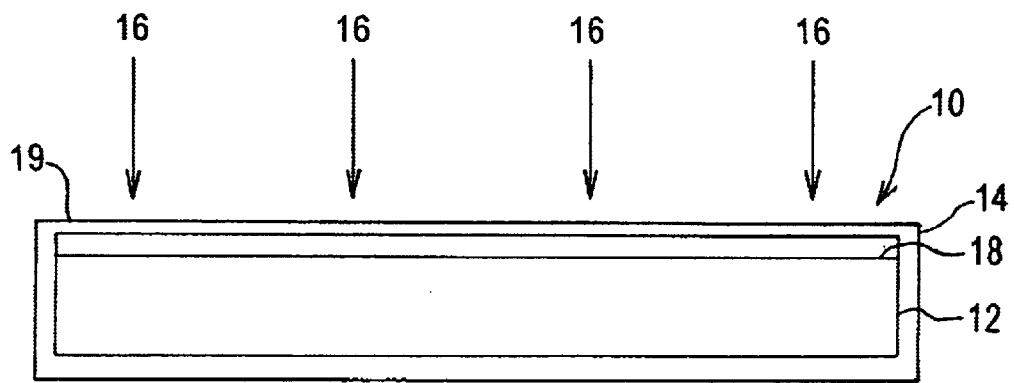

A method of forming a semiconductor device on a SOI substrate using a Smart Cut® technique will be described first. An upper section 10 is formed by the following steps: A monocrystalline silicon wafer 12 is provided, as shown in FIG. 1A. A layer of thermally grown silicon oxide 14 is formed on the silicon wafer 12, as shown in FIG. 1B. As shown in FIG. 1C, hydrogen ions 16 are implanted in silicon wafer 12 to a predetermined depth 18 to form the upper section 10. The implanted hydrogen ions create microcavities, microblisters or microbubbles in the implanted wafer. When the density and size of the microcavities reduce the cavity distance below a certain threshold, intercavity fractures occur and propagate though a percolation type process. This ultimately leads to a splitting of the wafer 12, as discussed below.

Figure 1D:
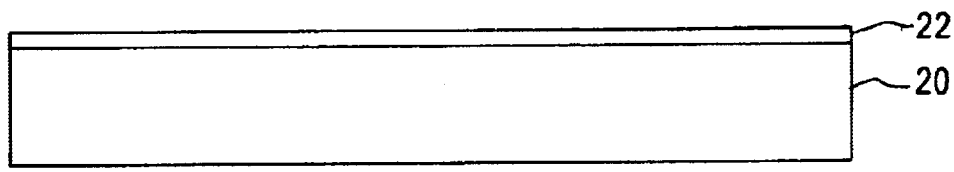

A lower section 40 is provided to be bonded to the upper section 10. The lower section 40 is formed as follows: A semiconductor substrate 20 is provided with a layer of compressive material formed thereon 22 (See FIG. 1D). The compressive material can be any of a number of compressive materials including silicon oxynitride ($SiO_xN_y$) plasma enhanced chemical vapor deposited (PECVD) phosphorous, silicon nitride ($Si_3N_4$), and boron/phosphorous doped silica glass (BPSG). The layer of compressive material 22 can be deposited by a number of conventional techniques, including chemical vapor deposition (CVD). The compressive material 22 is deposited to a thickness of about 500 Å to about 2000 Å.

Figure 1E:
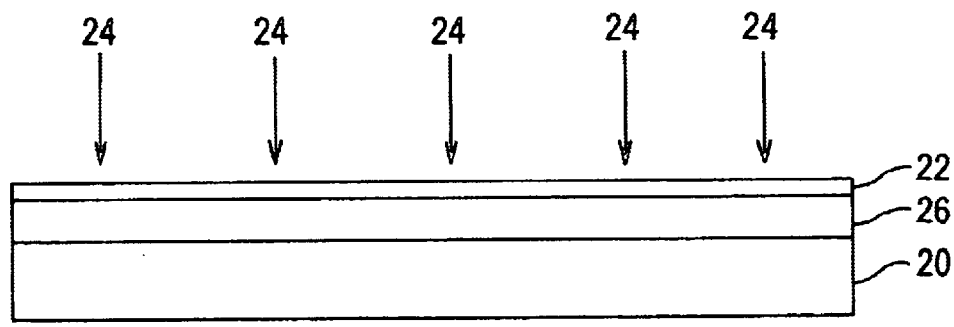
Figure 1F:
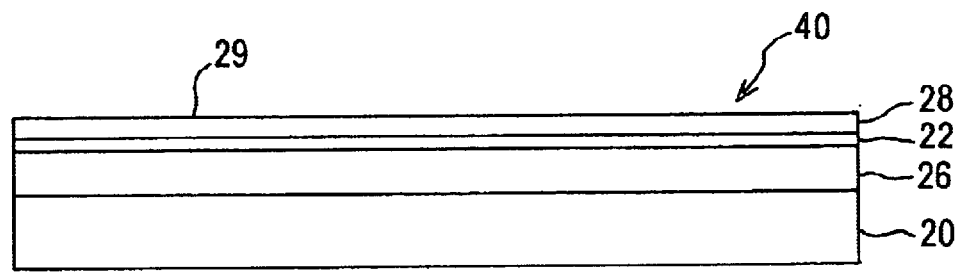

A BOX layer 26 is formed by a SIMOX process, as illustrated in FIG. 1E. In the SIMOX process Oxygen ions 24 are implanted into the semiconductor substrate 20. In certain embodiments of the instant invention, oxygen ions 24 are implanted into the semiconductor substrate 20 at an energy in the range of from about 70 keV to about 200 keV and at a dose in the range from about $1.0 \times 10^{17}$ cm$^{-2}$ to about $1.0 \times 10^{18}$ cm$^{-2}$. After implantation, the lower section 40 is annealed at a temperature in the range from about 1250° C. to about 1400° C. for about 4 to about 6 hours in an atmosphere comprising an inert gas and from about 0.2% to about 2.0% $O_2$ to form the BOX layer 26. The $O_2$ in the annealing atmosphere forms a thin oxide layer 28 on the lower section 40. The oxide layer 28 improves subsequent adhesion to the hydrogen ion implanted upper section 10.

Figure 1G:
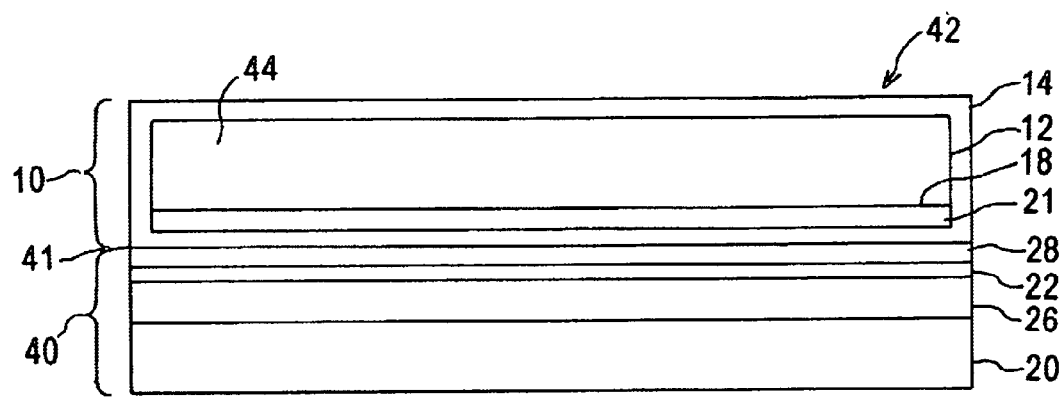

As shown in FIG. 1G, the upper section 10 and the lower section 40 are bonded to each other at the interface 41 of their respective oxide layers 14 and 28. In certain embodiments, the bonding surfaces 19, 29 of the upper section 10 and the lower section 40 are polished to a low surface roughness, eg., 2 Å/μm² RMS. The lower section 10 and the upper section 40 are pressed together, as shown in FIG. 1G, and heated in an inert atmosphere at a temperature in the range of from about 900° C. to about 1200° C. for about 5 minutes to about 5 hours to fuse the lower section 10 and the upper section 40.

In certain embodiments, an oxidizer, such as a drop of an aqueous solution of $H_2O_2$ or $HNO_3$ and $H2O_2$ is provided in the interface between the upper section 10 and the lower section 40. The oxidizer improves the bonding process by allowing relatively lower temperature bonding, providing better stress compensation by providing dopants in the bonding liquid which will produce a bonding layer which has closely matched coefficients of thermal expansion to that of a substrate wafers, and limiting contaminant migration by the use of dopants in the bonding liquid that will provide a bonding layer that is a barrier to diffusion of mobile contaminants.

Figure 1H:
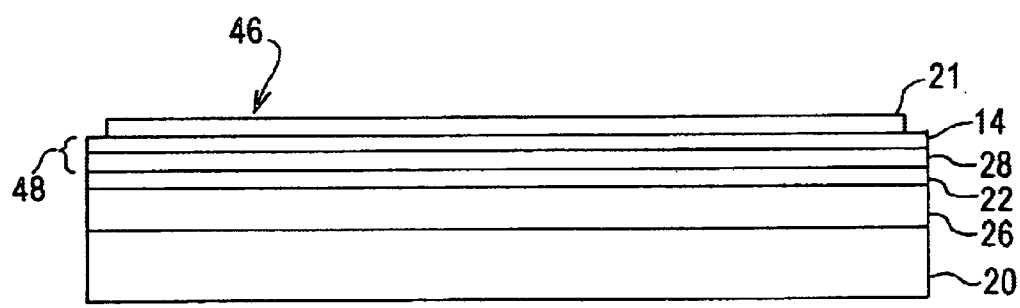

The combined wafer/semiconductor substrate 42 is annealed at about 1100° C. for about 2 hours. This annealing step causes the microcavities in the hydrogen doped upper section 10 to propagate causing the wafer 12 to split. A bulk silicon portion 44 of the upper section 10 is then lifted off the lower section 40 leaving behind an adhered silicon layer 21. Thus, a SOI substrate with a layer of compressive material formed in the BOX layer is obtained, as shown in FIG. 1H. In certain embodiments, after the formation of the semiconductor structure 46 (See FIG. 1H), the structure 46 is polished because the split SOI structure exhibits microroughness.

The SOI semiconductor structure 46 comprises a first insulating layer 26 (lower BOX layer), and a second insulating layer 48 (oxide layers 14 and 28 (upper BOX layer)), with a layer of compressive material 22 interposed therebetween. The thicknesses of the first insulating layer 26 and second insulating layer 48 are each from about 500 Å to about 4000 Å. In certain embodiments of the present invention, the layer of compressive material 22 is substantially centered in the vertical direction between the first insulating layer 26 and the second insulating layer 48, although it is not necessary for the layer of compressive material 22 to be vertically centered between the insulating layers 26, 48. The layer of compressive material 22 induces a lattice mismatch of from about 0.2% to about 1.5% in the silicon layer 21.

Figure 2A:
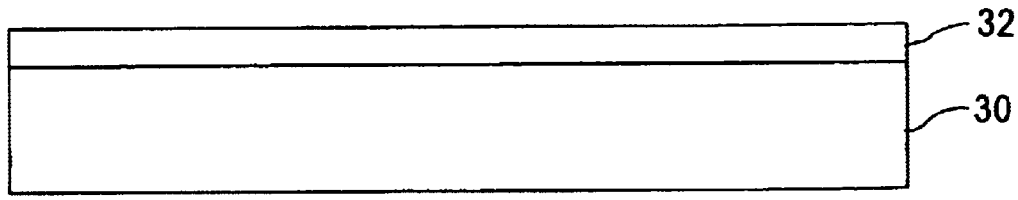
FIGS. 2A–2G illustrate the formation of a SOI semiconductor device with a layer of compressive material in a buried oxide layer using a wafer bonding technique.
Figure 2B:
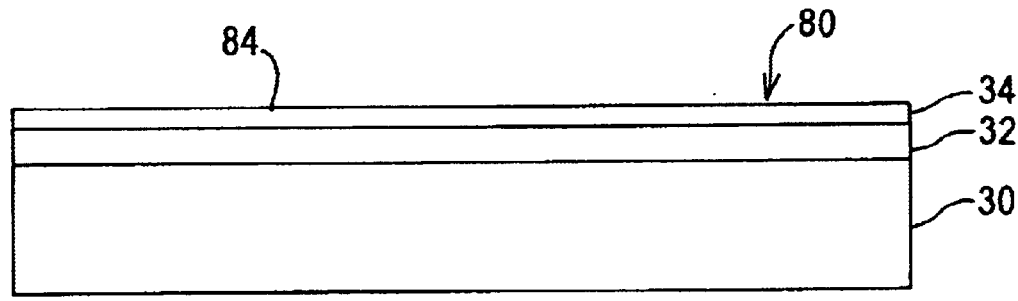

Another method of producing a semiconductor device with a strained silicon layer on a SOI semiconductor substrate with a layer of compressive material formed between BOX layers will be explained. An upper section 80 is formed by the following steps. A lightly doped epitaxial layer of silicon 32 is grown on a heavily doped silicon substrate 30 as shown in FIG. 2A. An oxide layer 34 is subsequently formed on the silicon layer 32. In certain embodiments, oxide layer 34 is formed by thermal oxidation of silicon layer 32. In certain other embodiments, oxide layer 34 is deposited, such as by CVD.

Figure 2C:
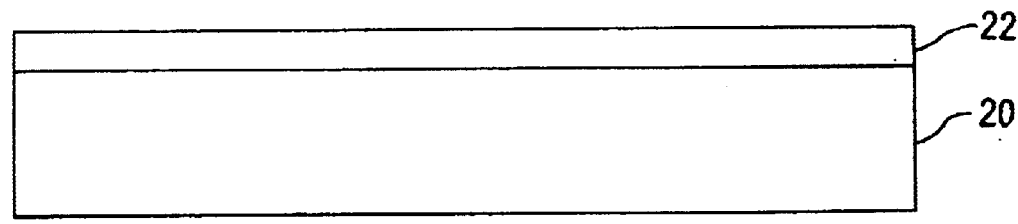
Figure 2D:
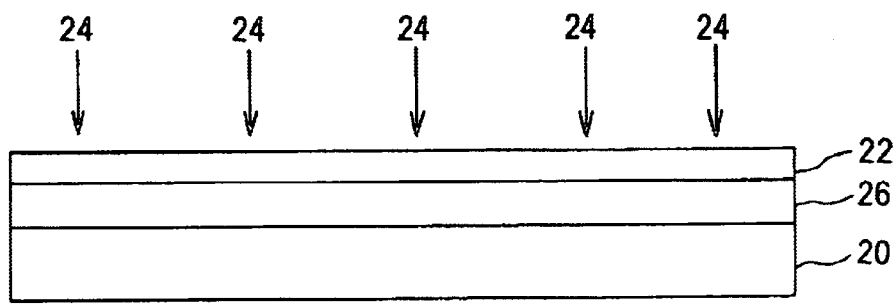
Figure 2E:
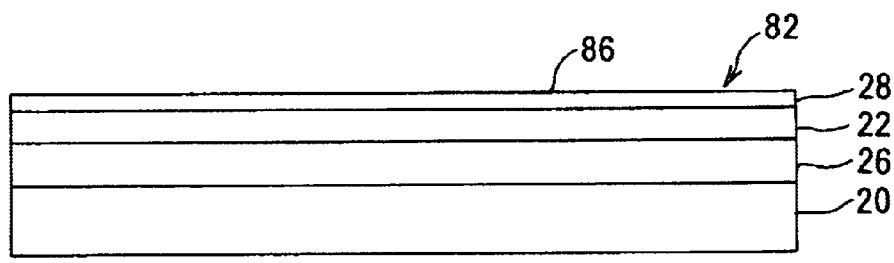
Figure 2F:
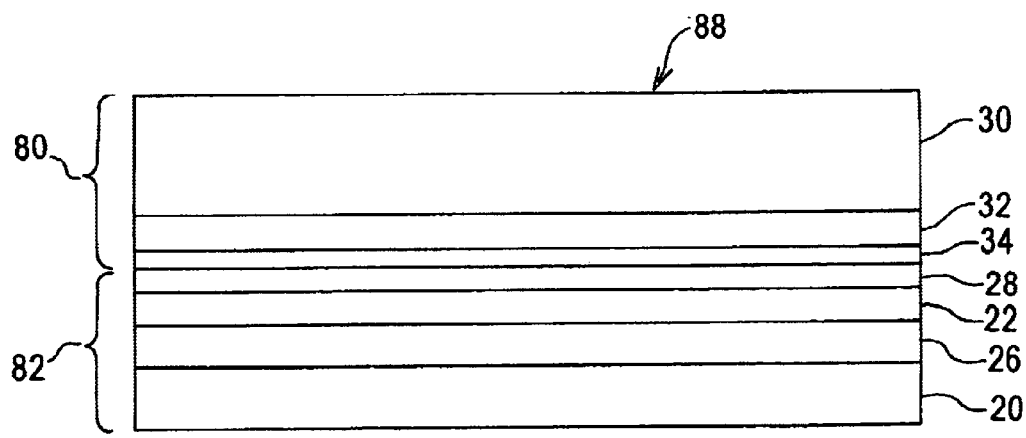
Figure 2G:
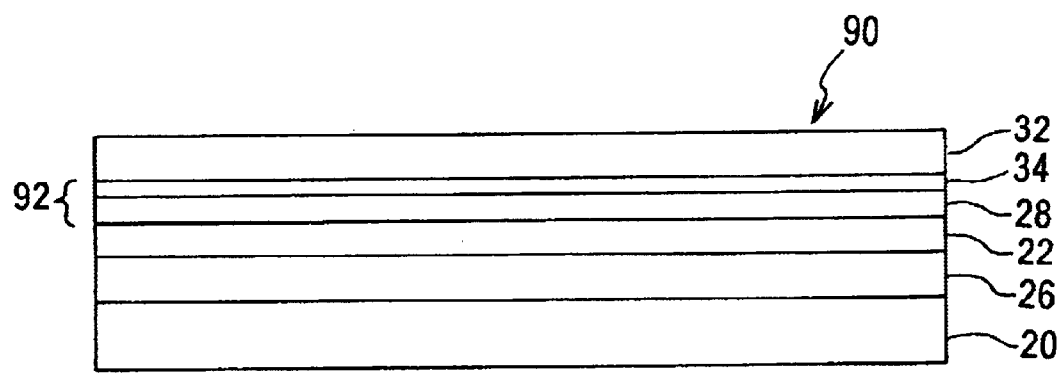

A lower section 82 is provided to be bonded to the upper section 80. The lower section 82 is formed as follows: A lightly doped silicon semiconductor substrate 20 is provided with a layer of compressive material 22 formed thereon, as shown in FIG. 2C. Oxygen ions 24 are implanted into semiconductor substrate 20 by a SIMOX process, as described in the previous embodiment. The semiconductor substrate 20 is subsequently annealed to form BOX layer 26, as shown in FIG. 2D. The annealing is performed in an atmosphere of inert gas and about 0.2% to about 2% $O_2$, such that oxide layer 28 is formed, as shown in FIG. 2E In certain embodiments, oxide layer 28 is deposited, such as by CVD. In certain embodiments, bonding surfaces 84 and 86 are polished prior to bonding the upper section 80 and lower section 82. The upper and lower sections 80, 82 are squeezed together so that the bonding surfaces 84, 86 of the respective oxide layers 34, 28 are brought into contact and the combined structure 88, as shown in FIG. 2F, is annealed at about 900° C. to about 1200° C. for 5 minutes to about 5 hours, to effect bonding. In certain embodiments, a drop of an oxidizing solution such as an aqueous hydrogen peroxide or nitric acid and hydrogen peroxide solution is deposited on one of the bonding surfaces 84, 86 prior to bonding the upper and lower sections 80, 82.

After the oxide layers 28, 34 are fused, the heavily doped substrate 30 is roved, such as by preferentially etching the heavily doped substrate 30 to provide a SOI semiconductor device 90 with a strained silicon layer 32, wherein the strain is induced by a layer of compressive material 22 interposed between the BOX layers 26, 92.

The layer of compressive material 22 comprises PECVD phosphorous, BPSG, $SiO_xN_y$, or $Si_3N_4$. The thickness of the layer of compressive material 22 is from about 500 Å to about 2000 Å. The thickness of the lower BOX layer 26 and the upper BOX layer 92 are each from about 500 Å to about 4000 Å. In certain embodiments of the invention, the layer of compressive material 22 is substantially centered in the vertical direction between the lower BOX layer 26 and the upper BOX layer 92. The layer of compressive material 22 induces a lattice mismatch of from about 0.2% to about 1.5% in the strained silicon layer 32.

Figure 3A:
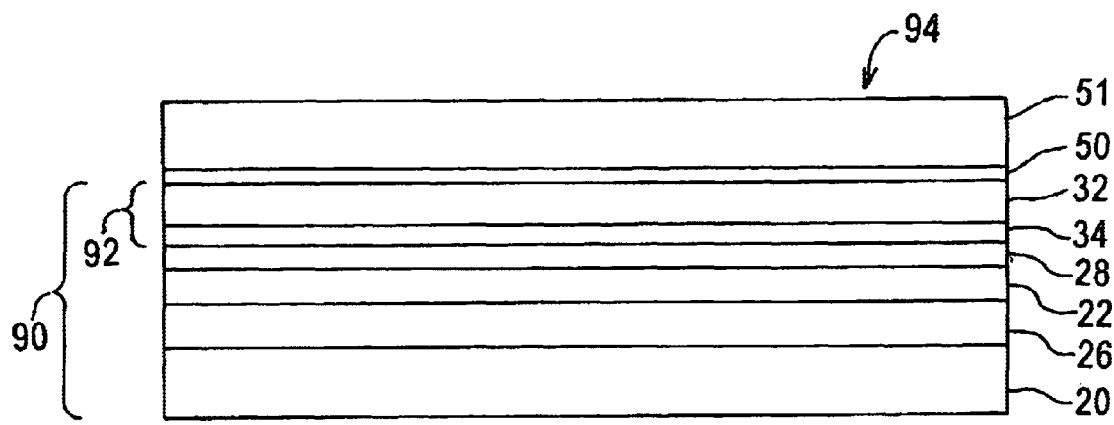
FIGS. 3A–3E illustrate the formation of a field effect transistor on a SOI semiconductor substrate with a layer of compressive material in a buried oxide layer.
Figure 3B:
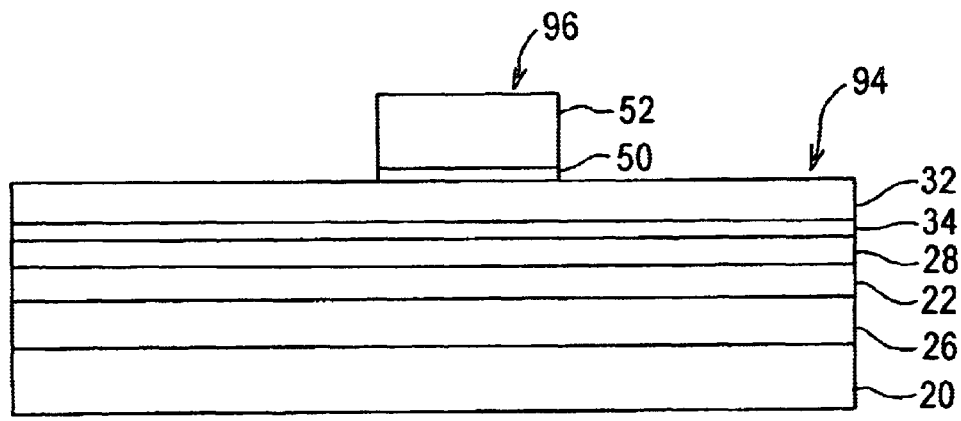
Figure 3C:
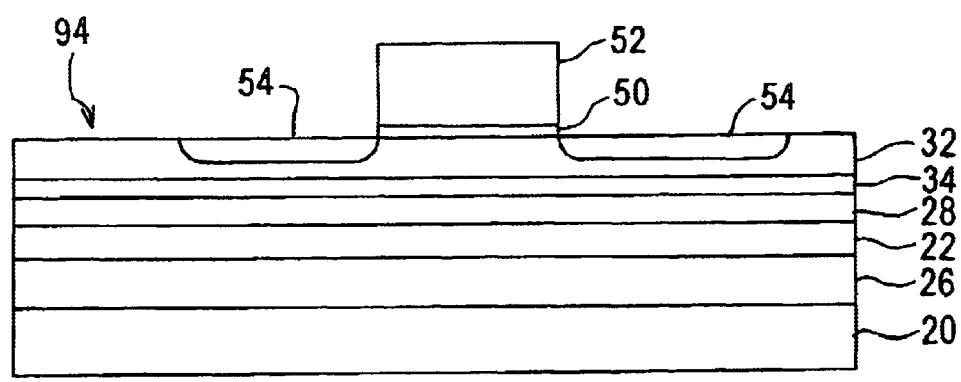

A method of forming a semiconductor device, such as a metal oxide semiconductor field effect transistor (MOSFET) will be discussed. A SOI semiconductor device 94 with a strained silicon layer 32 and a layer of compressive material 22 formed between two BOX layers 26, 92 is provided with a gate oxide layer 50 and a gate conductive layer 51 formned thereon. Gate oxide layer 50 is formed in a conventional manner, such as by thermal oxidation of silicon layer 32 or CVD. Gate conductive layer 51 is formed from conventional materials, such as polysilicon or a metal. The structure 94 is patterned, such as by photolithographic patterning to form gate structure 96 with a gate conductor 52, as shown in FIG. 3B. The resultant structure then undergoes implantation of dopant to form source/drain extensions 54. The selective implantation of dopant is performed by conventional methods including, in certain embodiments, the formation of a photoresist mask over the semiconductor device 94 and the implantation of conventional dopant.

Figure 3D:
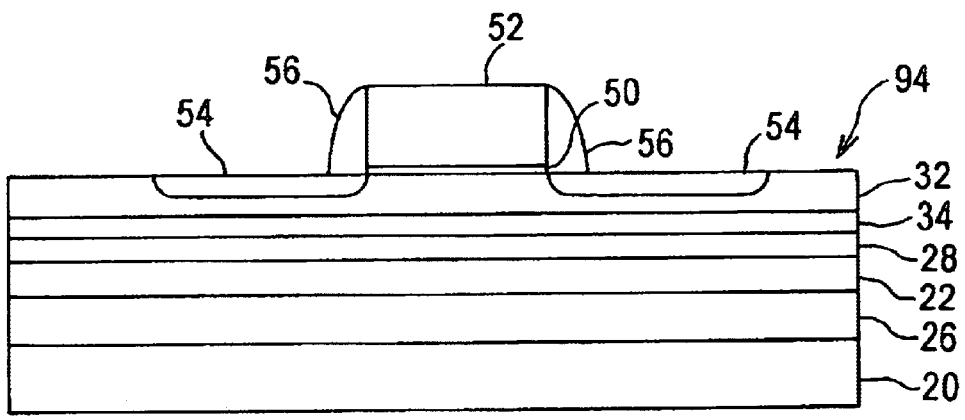
Figure 3E:
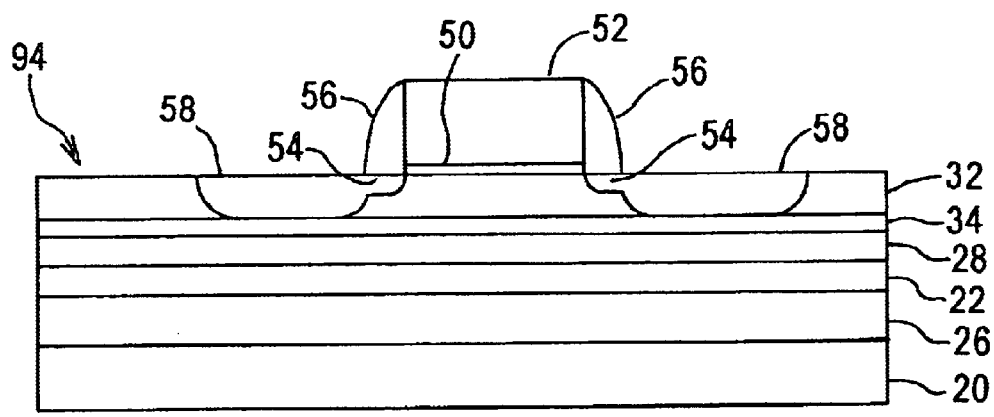

A silicon nitride layer is subsequently deposited over the semiconductor structure 94 and anisotropically etched to form sidewall spacers 56, as shown in FIG. 3D. The semiconductor structure subsequently undergoes heavier doping to form source/drain regions 58 according to conventional methods, as shown in FIG. 3E. The resultant structure 94 is annealed to activate source/drain regions 58, providing a MOSFET semiconductor device formed on a SOI substrate with a strained silicon channel.

Figure 4A:
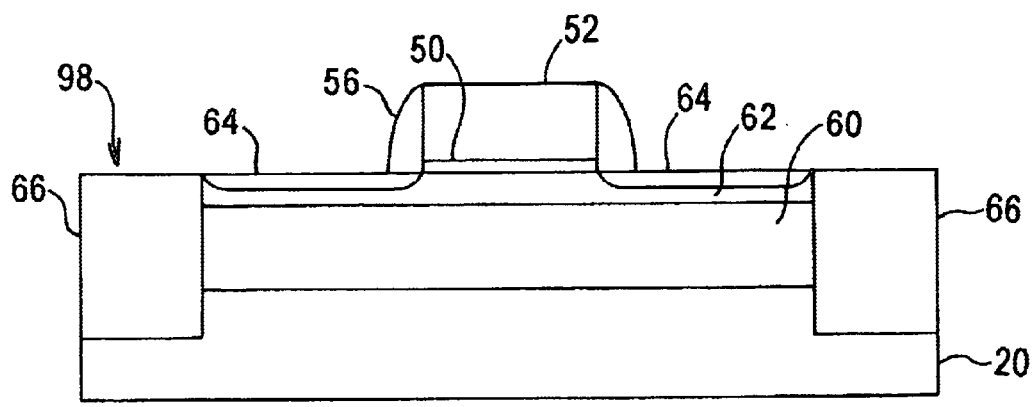
FIGS. 4A–4C illustrate the formation of a field effect transistor with a strained silicon channel and higher levels of arsenic dopant in the source/drain regions.
Figure 4B:
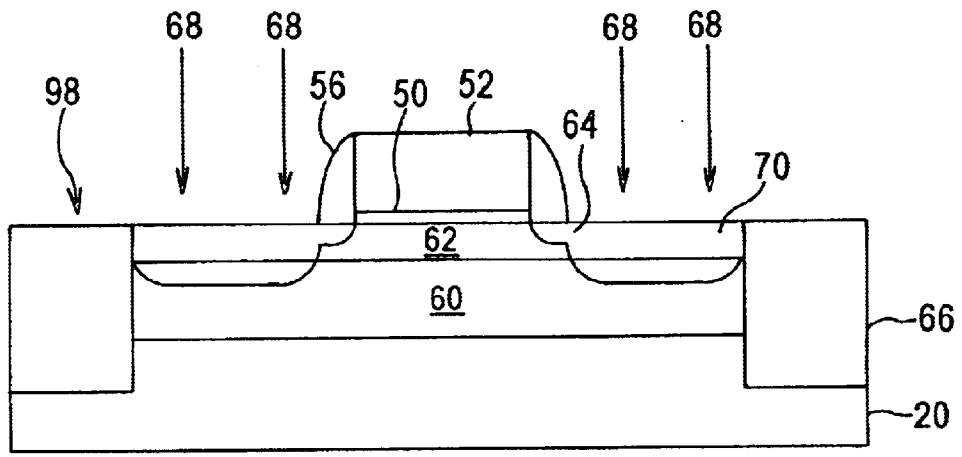
Figure 4C:
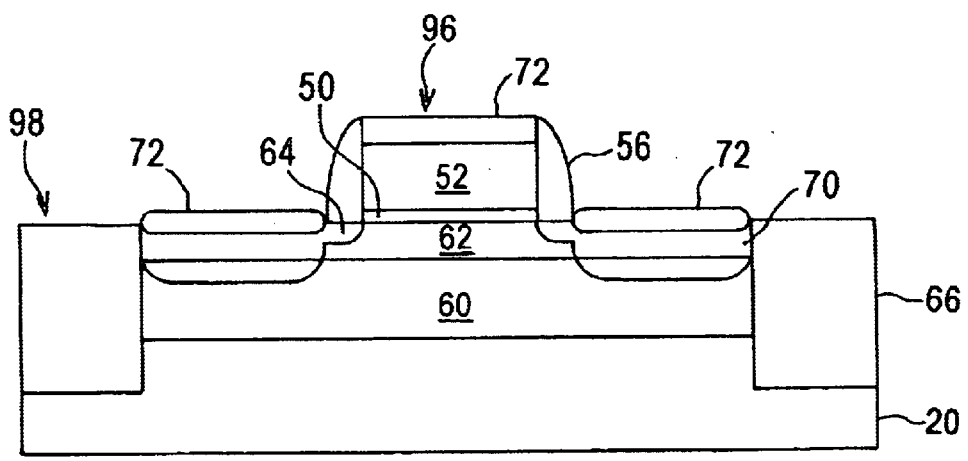

In other aspects, strained silicon layers are formed on SiGe layers. When arsenic (As) is doped into semiconductor devices comprising a strained silicon layer formed on a SiGe layer, the As diffuses more slowly in the SiGe than in strained silicon. FIG. 4A–4C illustrates a MOSFET semiconductor device formed on semiconductor substrate 20 with a SiGe layer. A shallow trench isolation region 66 isolates a MOSFET 98 from neighboring MOSFETs. SiGe layer 60 induces lattice strain in a silicon layer 62, as the silicon lattice strains to match the lattice spacing of the SiGe layer 60. Lightly doped source/drain extensions 64 are formed in the strained silicon layer 62.

As shown in FIG. 4B, As 68 is implanted at an increased dose to compensate for the slow diffusion of As in the SiGe layer 60. The semiconductor device 98 is subsequently annealed to activate source/drain regions 70.

As shown in FIG. 4C, conductive silicide layers 72 can be formed on the gate structure 96 and source/drain regions 70.

The conductive silicide layers are formed by depositing a metal, such as cobalt or nickel over the semiconductor structure 98 and subsequently annealing the semiconductor structure 98 to react the metal with silicon in the source/drain region 70 and the gate conductor 52 to form metal silicide 72. The unreacted metal is subsequently removed from semiconductor device 98, as shown in FIG. 4C.

The increased dose of As ions reduces the sheet resistance of the source/drain regions and source/drain extensions to reduce the parasitic source/drain resistance. The increased dose of As ions also reduces silicon/silicide contact resistance. In addition, the low barrier height to the SiGe layer further reduces silicon/silicide contact resistance.

The methods of the present invention provide an improved semiconductor device with the high-speed capabilities of silicon on insulator and strained silicon technologies. The layer of compressive material on the semiconductor substrate allows the formation of strained silicon layers without requiring the formation of a SiGe underlayer.

The embodiments illustrated in the instant disclosure are for illustrative purposes only. They should not be construed to limit the claims. As is clear to one of ordinary skill in the art, the instant disclosure encompasses a wide variety of embodiments not specifically illustrated herein.

What is claimed is:

1. A semiconductor device comprising:
   a semiconductor substrate,
   a layer of compressive material on the semiconductor substrate, and
   a layer of strained silicon on the layer of compressive material.

2. The semiconductor device of claim 1, further comprising a first insulating layer interposed between the layer of compressive material and substrate.

3. The semiconductor device of claim 1, further comprising a second insulating layer interposed between the layer of compressive material and the layer of strained silicon.

4. The semiconductor device of claim 3, further comprising an insulating layer between the substrate and the layer of compressive material.

5. The semiconductor device of claim 4, wherein the first insulating layer and the second insulating layer are buried oxide layers.

6. The semiconductor device of claim 4, wherein the thickness of each of the first insulating layer and the second insulating layer is from about 500 Å to about 4000 Å.

7. The semiconductor device of claim 4, wherein the layer of compressive material is centered in the vertical direction between the first insulating layer and the second insulating layer.

8. The semiconductor device of claim 1, wherein the layer of compressive material comprises $SiO_xN_y$, plasma enhanced chemical vapor deposited phosphorus, $Si_3N_4$, or boron/phosphorus doped silica glass.

9. The semiconductor device of claim 1, wherein the thickness of the layer of compressive material is from about 500 Å to about 2000 Å.

10. The semiconductor device of claim 1, wherein the layer of strained silicon has a lattice mismatch of from about 0.2% to about 1.5%.

11. The semiconductor device of claim 1, wherein the semiconductor device is a MOSFET.

12. A method of forming a semiconductor device with a strained silicon layer comprising:
   providing a semiconductor substrate,
   forming a layer of compressive material on the semiconductor substrate, and forming a strained silicon layer over the layer of compressive material.

13. The method according to claim 12, wherein the layer of compressive material is formed by depositing a layer of phosphorus, boron/phosphorus doped silica glass, $SiO_xN_y$, or $Si_3N_4$.

14. The method according to claim 12, further comprising forming a first insulating layer between the semiconductor substrate and the layer of compressive material.

15. The method according to claim 14, further comprising forming a second insulating layer between the layer of compressive material and the strained silicon layer.

16. The method according to claim 15, wherein the first insulating layer and the second insulating layer are buried oxide layers.

17. The method according to claim 16, wherein the first insulating layer is formed by a SIMOX process.

18. The method according to claim 15, wherein the buried oxide layers are formed by a wafer bonding process or a smart cut process.

19. The method according to claim 15, wherein the layer of compressive material is substantially centered in the vertical direction between the buried oxide layers.

20. The method according to claim 15, further comprising forming a field effect transistor including the steps of:
 depositing a gate oxide layer over the strained silicon layer,
 forming a conductive layer over the gate oxide layer,
 patterning the gate oxide layer and the conductive layer to form a gate structure,
 implanting dopant into the strained silicon layer to form source and drain regions, and
 activating the source and drain regions.

* * * * *